United States Patent
Kobayashi et al.

[11] Patent Number: 5,602,060
[45] Date of Patent: Feb. 11, 1997

[54] PROCESS FOR THE PRODUCTION OF SEMICONDUCTOR DEVICES

[75] Inventors: Michiko Kobayashi; Syun-ichi Fukuyama; Yoshihiro Nakata; Masanori Naitou; Hiroshi Kudo; Yoshiyuki Ohkura, all of Kawasaki, Japan

[73] Assignee: Fujitsu Limited, Kanagawa, Japan

[21] Appl. No.: 582,808

[22] Filed: Jan. 4, 1996

Related U.S. Application Data

[63] Continuation of Ser. No. 297,990, Aug. 30, 1994, abandoned.

[30] Foreign Application Priority Data

Aug. 31, 1993 [JP] Japan ................................. 5-214649
Aug. 30, 1994 [JP] Japan ................................. 6-204832

[51] Int. Cl.$^6$ ................................................. B05D 3/02
[52] U.S. Cl. ...................... 437/238; 437/235; 427/228; 427/126.2
[58] Field of Search .............................. 437/223, 235, 437/238; 427/126.2, 228

[56] References Cited

U.S. PATENT DOCUMENTS

| | | | |
|---|---|---|---|
| 4,220,600 | 9/1980 | Yajima et al. | 556/434 |
| 4,650,837 | 3/1987 | Seyferth et al. | 525/478 |
| 4,756,977 | 7/1988 | Haluska et al. | 428/704 |
| 5,059,448 | 10/1991 | Chandra et al. | 437/238 |
| 5,138,080 | 8/1992 | Jung et al. | 556/430 |
| 5,370,903 | 12/1994 | Mine et al. | 437/238 |
| 5,380,555 | 1/1995 | Mine et al. | 437/238 |
| 5,387,480 | 2/1995 | Haluska et al. | 437/238 |
| 5,399,441 | 3/1995 | Bearinger et al. | 437/238 |

FOREIGN PATENT DOCUMENTS

3-205890 9/1991 Japan.
5-262819 10/1993 Japan.

*Primary Examiner*—R. Bruce Breneman
*Assistant Examiner*—Felisa Garrett
*Attorney, Agent, or Firm*—Nikaido, Marmelstein, Murray & Oram LLP

[57] ABSTRACT

Process for the production of semiconductor devices comprising the steps of applying a solution of the specified polycarbosilane in a solvent onto a substrate having electrically conductive components fabricated therein, and curing the coated layer of the polycarbosilane at a temperature of not less than 350° C. in an oxidizing atmosphere to thereby covert the polycarbosilane layer to a silicon oxide layer. The resulting silicon oxide layer has a planarized surface and has no cracking and accordingly is useful as a dielectric layer and a protective layer in the production of semiconductor devices having a high reliability.

10 Claims, 4 Drawing Sheets

PROCESS FOR THE PRODUCTION OF SEMICONDUCTOR DEVICES

This application is a continuation of application Ser. No. 08/297,990 filed Aug. 30, 1994 now abandoned.

BACKGROUND OF THE INVENTION

1. Field of the Invention

The present invention relates to a process for the production of a semiconductor device. More particularly, the present invention relates to a method of forming an electrically insulating layer, i.e., dielectric layer, between metal or other electrically conducting layers in the semiconductor device. The dielectric layer is referred hereinafter to as an interlayer dielectric layer. Also, the dielectric layer can act as a protective layer for protecting the device from the environment, if it is applied to the top surface of the device.

As is appreciated from the following descriptions of the present invention, the term "semiconductor device" used herein is intended to mean a variety of devices having a substrate consisting of semiconductor material, such as semiconductor integrated circuits (ICs), large-scale-integration circuits (LSIs), very-large-scale-integration circuits (VLSIs), ultra-large-scale-integration circuits (ULSIs) and the like as well as other electronic devices using semiconductor material.

2. Description of the Related Art

In recent years, the integration of the semiconductor devices has been surprisingly advanced for the purpose of attaining rapid processing of voluminous information. The LSI and VLSI circuits are commercially worked, and further the ULSI circuits will be worked soon. Note that the advances in the integration do not rely upon the expansion of the size or dimension of the device, i.e., chip, but, can be attained by miniaturizing and increasing of components to be fabricated in the chip and accordingly reducing the dimension of the chips. As a result, the minimum size of line and space of the wiring in the chips is on the order of submicrons and as a necessity, the wiring structure adopted in recent chips is a multilayer or multilevel wiring or metallization structure.

In the prior art production of integrated semiconductor devices, fine patterns of semiconductor regions, electrodes, wiring and other components are fabricated onto the semiconductor substrate by using conventional process steps such as ion implantation of impurities, thin film deposition and photolithography. The thus resulting patterned wiring layer contains a plurality of fine topographic features (projections and depressions) and steps.

After formation thereof, an interlayer dielectric layer is formed over the patterned wiring layer, and then via-holes or through-holes are bored in the predetermined sites of the dielectric layer. The next wiring layer is deposited and patterned over the dielectric layer, and the upper and lower wiring layers are electrically connected by using the above-mentioned process steps. The desired integrated semiconductor device is thus provided.

The dielectric layer sandwiched between two patterned wiring layers must to satisfy the following requirements:

1. It should show an excellent dielectric property, i.e., electrical insulating property.
2. It should show a good resistance to heat.
3. It should have a smooth surface, namely, it should show good planarization.
4. It should show a good resistance to cracking.

A plurality of dielectric materials have been proposed for use as interlayer dielectric layers, however, none of them is considered to be sufficiently satisfy all the above-mentioned requirements. The dielectric layer-forming materials include both inorganic and organic dielectric materials, and they are applied over the wiring layer by a chemical vapour deposition (CVD) process, sputtering process or spin-coating process, for example.

Typical examples of useful inorganic dielectric materials include silicon dioxide ($SiO_2$), silicon nitride ($Si_3N_4$) and phosphosilicate glass (PSG). The dielectric layer formed from these inorganic materials exhibits an excellent dielectric property and resistance to heat, however, if it is formed by thin film deposition technology such as CVD or sputtering process, the dielectric layer suffers from unevenness of the surface and thus disconnection of the wiring, because it can exactly reproduce an uneven and stepped profile of the underlying wiring layer.

On the other hand, typical examples of useful organic dielectric materials include polyimide resins and so-called "organic SOG (spin-on-glass)". The polyimide resins, particularly, recently developed photo-sensitive polyimide resins are useful in view of their good workability, because they can be subjected to a photolithographic process without using a resist material as a patterned mask. However, due to presence of imide rings having a higher polarity in the molecular structure thereof, the polyimide resins show a higher hygroscopicity or moisture absorption, and thus cause a problem that a dielectric property of the resulting layer is lowered as a result of an increase of the apparent dielectric constant which increase with moisture adsorption.

The SOG materials are those produced from silicon alkoxide of the formula: $Si(OR)_4$ wherein R represents an alkyl group, which is then hydrolyzed to provide the following equilibrium condition of the reaction:

Using the SOG materials, it is possible to provide a thick dielectric layer having a smooth surface, because they can be spin-coated, and the dielectric property and heat resistance of the resulting layer are not so high as those of the above-mentioned inorganic dielectric materials, but are sufficiently high for practical use. However, the SOG layer suffers from formation of fine pores and cracking. Namely, upon heating of the SOG layer coated over the substrate, the hydroxyl (OH) groups constituting $Si(OH)_n(OR)_{4-n}$ are condensed with dehydration to produce a cross-linked product having the unit Si—O—Si which is effective as a dielectric film having an excellent heat resistance. However, due to evaporation and decomposition of ROH upon heating, in addition to evaporation of $H_2O$ produced from said condensation with dehydration, fine pores are liable to be produced in the SOG layer, and also cracks is liable to occur as a result of progress of curing which can act to clog said pores.

Based on the recognition of the above facts, the formation of an interlayer dielectric layer in semiconductor devices has been further advanced, and particularly, use of organosilicone polymers as an organic dielectric material has been taught in patent and other publications. The organosilicone polymers can be applied with a spin-coater, and accordingly enable the production of a thick dielectric layer having a smooth surface and thus semiconductor devices with a higher yield of production. The prior art organosilicone polymers, however, still suffer from the cracking problem. Moreover, the practically used prior art organosilicone polymers, while they can be spin-coated with smoothing of the layer surface, result in an insufficient smoothing effect, which is not sufficient to accomplish a global planarization in the obtained dielectric layer.

The global planarization will be further described with reference to the accompanying drawings.

Figure 3:
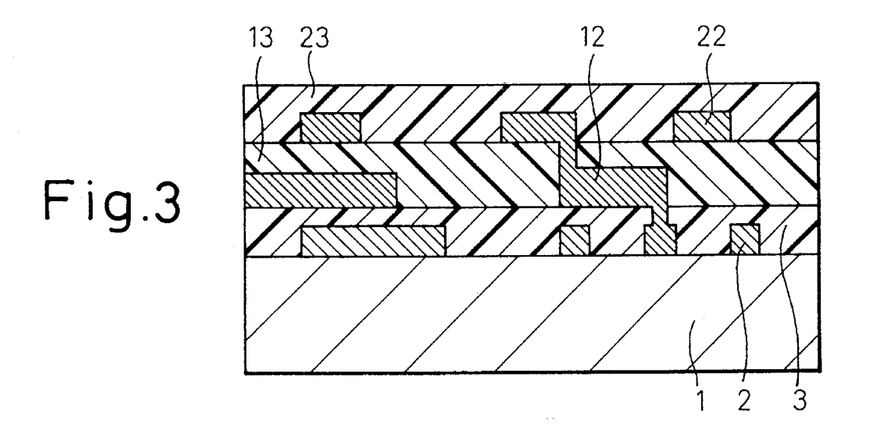
FIG. 3 is a cross-sectional view of a semiconductor device according to the present invention having a multilayer or multilevel metallization structure.

FIG. 3 is a cross-sectional view of a semiconductor device having a multilayer or multilevel metallization (three-level metallization) structure in which a silicon substrate 1 has applied thereto three metal layers 2, 12 and 22. Aluminum is used herein as the metal. As is illustrated, the metal layers 2 and 12 are separated from each other through an interlayer dielectric layer 3 and wiring or electrodes of these layers are interconnected through the aluminum filled in a via-hole formed between the layers 2 and 12. Similarly, an interlayer dielectric layer 13 is sandwiched between two metal (Al) layers 12 and 22. A protective layer 23 having a dielectric property as in the dielectric layers 3 and 13 is disposed over the metal layer 22. In the illustrated semiconductor device, each of the dielectric layers 3 and 13 must be globally planarized, i.e., must have a global flat surface, so that the next metal layer can be formed over the dielectric layer without any difficulties.

Figure 1:
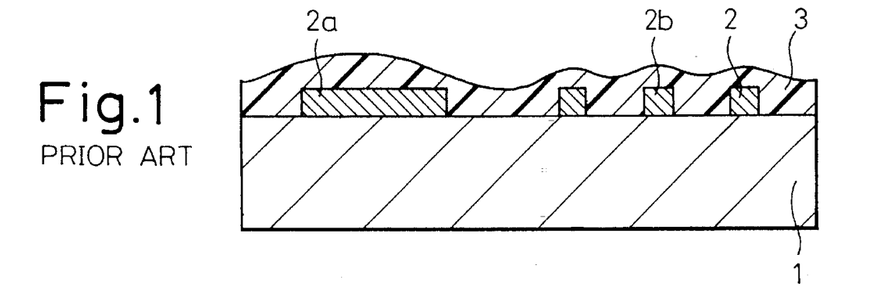
FIG. 1 is a cross-sectional view of a prior art semiconductor device having an uneven dielectric layer.

According to the prior art methods, discussed above, it is difficult to accomplish a global planarization in the multilevel metallization structure. Referring to FIG. 1, it illustrates a cross-sectional view of a prior art semiconductor device having a defective dielectric layer. A patterned metal layer 2 formed over a silicon substrate 1 has two types of patterned steps, i.e., a relatively wide step 2a such as an electrode and a relatively narrow step 2b such as wiring. After formation of the metal layer 2, a dielectric layer 3 is spin-coated over the metal layer 2 by using the above-mentioned organosilicon polymers. The resulting dielectric layer 3, as illustrated, has an uneven surface due to low step coverage of the organosilicon polymers used as a dielectric material. Note that in the areas having the wide step 2a, the layer thickness of the dielectric layer is substantially the same as in the "space" areas having no electrodes or wiring. Desirably, the resulting dielectric layer should have a smooth or planarized surface over the full area of the underlying metal layer regardless of the presence or absence of steps or patterns therein. In other words, it is desired to practice an improved method of forming an interlayer dielectric layer from an organosilicon polymer which method does not cause a cracking problem and also ensures a global planarization.

The inventors of this application have found that a specified polyorganosilsesquioxane (PMMS) is soluble in an organic solvent, can be admixed with the organic solvent to control the viscosity thereof to a desired level, and accordingly is spin-coatable, and the coated layer of the polyorganosilsesquioxane is useful as an interlayer dielectric layer because it can satisfy the above-mentioned requirements concerning the resistance to cracking, planarization, heat resistance, dielectric property and the like. The polyorganosilsesquioxane can be prepared by hydrolyzing organotrichlorosilane or organotrialkoxysilane as a starting material and then condensing with dehydration. Preparation of polyorganosilsesquioxane and use thereof as an interlayer dielectric layer in semiconductor devices are described in, for example, U.S. Pat. No. 4,670,299, which isclosure is described herein for reference. The newly developed polyorganosilsesquioxane can be advantageously used as an interlayer dielectric layer in the production of semiconductor devices, however, there remains the problem that a satisfactory global planarization cannot be attained.

Further, it is noted that if the above-described organic dielectric materials such as polyimide and silicone resins are used in the formation of an interlayer dielectric layer, the dielectric layer is liable to release gases as a result of oxidation of organic groups contained in the layer-forming material during the oxygen ($O_2$) plasma processing in the multilevel metallization process. The gas generated in the dielectric layer will result in defective areas in the obtained devices and also the oxidation and thermal decomposition of the dielectric material due to exposure to an elevated temperature of around 400° C. will cause a distortion of the dielectric layer and accordingly cracking therein.

On the other hand, use of inorganic dielectric materials such as silicon dioxide and silicon nitride requires use of an expensive apparatus such as a CVD apparatus provided with a vacuum system. In addition, the use of inorganic materials has the drawback that explosive and toxic materials must be used as a source for deposition.

The combined use as a laminated structure of the organic dielectric materials such as polyimide and polyorganosiloxane resins and inorganic dielectric materials such as silicon dioxide, silicon nitride and phosphosilicate glass has been adopted in the formation of the dielectric layer. Generally, a layer of the organic dielectric material is used as the principal portion of the dielectric layer and a layer of the inorganic dielectric material is applied over the organic dielectric layer as a protective layer from the oxygen plasma processing. However, since each of the dielectric materials used has unavoidable drawbacks, the resulting dielectric layer is not satisfactory for use in semiconductor devices. In fact, it is difficult to avoid damage to the underlying organic layer due to application of an elevated temperature during formation of an inorganic layer with the CVD process.

To avoid oxidation decomposition during the oxygen plasma processing, it is contemplated to use a thin coating of fluorocarbon resins such as Teflon™. However, these resins have the added problem that the resin coating will be decomposed upon thermal treatment in the production process of the semiconductor devices, because the thermal resistance of such resins is not good and on the order of 350° C.

With regard to cracking caused in the interlayer dielectric layer, there is another observation that silicone-type hard coat materials which are also spin-coatable can be used as a dielectric material, and upon curing, can provide a dielectric layer having a low coefficient of thermal expansion similar to that of the silicon oxide layer, however, the dielectric layer, even if it has a notably reduced layer thickness of 5000Å or less, cannot avoid cracking caused by the internal strain of the layer and thermal shock.

SUMMARY OF THE INVENTION

One object of the present invention is to provide a method of producing a semiconductor device which does not cause cracking and also enables a global planarization in the interlayer dielectric layer, when the dielectric layer is deposited over the patterned metal layer by using an organosilicon polymer as a dielectric material.

Another object of the present invention is to provide a method of producing a semiconductor device in which the dielectric material used is spin-coatable, and accordingly use of the CVD and other expensive apparatuses can be avoided, and at the same time, release of undesired gas from the dielectric layer during the plasma processing and cracking in the dielectric layer can be prevented.

Still another object of the present invention is to provide a method of producing a semiconductor device in which the dielectric material used does not cause cracking and other defects during thermal processing such as curing, while ensuring an excellent planarization of the dielectric layer.

Other objects of the present invention will be appreciated from the descriptions as set forth below with regard to the preferred embodiments thereof.

According to the present invention, the above object can be attained by a process for the production of a semiconductor device which comprises the steps of applying a solution of polycarbosilane of the general formula (1):

in which $R_1$ represents a hydrogen atom, a substituted or unsubstituted alkyl group having 1 to 4 carbon atoms or a substituted or unsubstituted aryl group;

$R_2$ represents a substituted or unsubstituted methylene or methyn group; and m and n each is a positive integer satisfying the condition of $10<m+n<1000$ and a ratio of n and m is less than $0.3$ ($n/m<0.3$), in a solvent onto a substrate having electrically conductive components fabricated therein, and curing the coated layer of the polycarbosilane at a temperature of not less than 350° C. in an oxidizing atmosphere to thereby convert the polycarbosilane layer to a silicon oxide layer.

The present invention is based on the findings that the prior art SOG materials are not suitable for accomplishing a global planarization, because, after they are spin-coated over a topographic substrate to form a layer having a smooth surface and the coated layer is then heated to cause curing thereof, a molten product of the SOG materials can not be produced. The remaining product is too solid and accordingly the flowability thereof over the substrate is insufficient to accomplish a global planarization. On the contrary, the polycarbosilane newly found by the inventors does not result in such a solid product. The polycarbosilane can first provide a molten product having a low viscosity, and then a hardened product upon curing and oxidation. The polycarbosilane does not contain any alkoxy group and silanol group, can relatively easily flow after spin-coating over the substrate, until its temperature is elevated to a temperature sufficient to initiate the condensation polymerization during the subsequent heating step. Note that the polycarbosilane is distinguished from the prior art polyorganosilsesquioxane (PMSS) previously developed by the inventors in view of the behavior in lowering the viscosity thereof. The PMSS can reduce its viscosity from a predetermined level of the temperature, and then can be cured. However, the extent of the viscosity reduction in the polycarbosilne is more notable than that of the PMSS. Namely, the polycarbosilane can exhibit a notably reduced viscosity, i.e., highly increased melting property. The polycarbosilane, after curing thereof, can finally exhibit a high viscosity.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

The production process according to the present invention is carried out by applying a solution of the polycarbosilane of the above-mentioned formula (1) as a dielectric layer-providing material in a suitable solvent onto a substrate having electrically conductive components fabricated therein.

In the general formula (1) of polycarbosilane used as the layer-forming material, $R_1$ represents a hydrogen atom, a substituted or unsubstituted alkyl group having 1 to 4 carbon atoms or a substituted or unsubstituted aryl group. The alkyl group may be a methyl, ethyl, propyl or butyl group which may be substituted or unsubstituted. Preferably, the alkyl group is an unsubstituted methyl group. The aryl group may be a phenyl, tolyl or naphthyl group which may be substituted or unsubstituted. Preferably, the aryl group is an unsubstituted phenyl group. The substituent $R_2$ represents a substituted or unsubstituted methylene or methyn group.

The polycarbosilane compounds used herein can be produced from the starting materials which are commercially available from several domestic or overseas manufacturers. They may be produced by using conventional polymerization processes. For example, the starting materials can be produced from polysilane as a starting material by heating an admixture of polysilane with polyborosiloxane in an inert atmosphere to thereby produce the corresponding polymer or by heating an admixture of polysilane with a low molecular weight carbosilane in an inert atmosphere and in the presence of a catalyst such as polyborodiphenylsiloxane to thereby produce the corresponding polymer. Note, these polymers are well-known as being useful as a raw material in the production of silicone carbide fibers.

The polycarbosilane of the above-mentioned formula (1) is applied from a suitable solvent onto a substrate having electrically conductive components fabricated therein. A wide variety of organic solvents can be used herein insofar as they are able to dissolve the polycarbosilane and at the same time effectively control the viscosity of the resulting polymeric solution as a coating solution. Suitable solvents include hydrocarbon solvents such as methylisobutylketone (MIBK), xylene, toluene, hexane, cyclohexane, octane, decane and the like.

Application of the polycarbosilane onto the topographic substrate can be carried out by using any conventional apparatus such as a spin coater, dip coater, roller coater and the like. Preferably, a spin coater is used, because the polycarbosilane used herein has a controlled viscosity suitable for such a coater.

The topographic substrate containing fabricated electric components, to which the solution of the polycarbosilane is applied, includes a wide variety of metal or electrically conducting layers found in conventional semiconductor devices. Typical examples of such a layer include a circuit or wiring layer, an electrode layer, and the like, and the materials of these layers include, for example, Al, Ti, TiN, W, TiW, CVD-$SiO_2$, SiON, PSG and the like.

The thickness of the polycarbosilane coating can be widely varied depending upon many factors such as particulars of the polycarbosilane used, particulars including configurations of the underlying layer, baking temperature and the like. Generally, the thickness of the polycarbosilane is preferred to be in the range of about 0.1 to 3 μm, more preferably about 0.5 to 2 μm.

After formation of the polycarbosilane coating, it is heated to a temperature of about 100° to 350° C. in order to melt the same to the lowest level of the viscosity. During this heating step, the excess solvent is evaporated from the coating.

The polycarbosilane coating is then cured at a temperature of not less than 350° C. in an oxidizing atmosphere. As a result of curing, the polycarbosilane is subjected to a condensation polymerization reaction, and thus alkyl group(s) and/or aryl group(s) as a branched chain are cleaved from the main chain of the polycarbosilane and at the same time, the main chain itself is decomposed into silane ($SiH_4$) and methylene ($CH_2$). Since the curing is carried out in an oxidizing atmosphere, the decomposition products can contribute for the formation of a silicon oxide ($SiO_2$) layer. Note that the resulting silicone oxide layer shows a notably diminished generation of internal strain in the layer, and it means that if the silicon oxide layer is incorporated as an interlayer dielectric layer into the semiconductor device, no or less cracking is observed in the dielectric layer.

Curing can be carried out at any temperature and time suitable for completing the conversion of the polycarbosilane to a silicon oxide layer, however, the curing temperature should not be below 350° C., because a lower temperature is insufficient to initiate the condensation polymerization reaction of the polycarbosilane. The upper limit of the curing temperature is not fixed to a predetermined level, and in practice, it can be varied depending upon particulars of the polycarbosilane used, particulars of the layers constituting the device and other factors, and particularly the material of the underlying layer. Generally, it is preferred that curing is carried out at a temperature of 350° C. to about 500° C., more preferably, about 400° C. to about 450° C. Similarly, the curing time can be varied under consideration of the curing temperature and other conditions, and generally, the preferred range of curing time is from about 30 minutes to about 60 minutes.

Curing can be carried out in a conventional curing chamber such as an electric oven, hot plate and the like.

Preferably, curing is carried out in an oxidizing atmosphere in the curing chamber. The oxidizing atmosphere used herein is preferably an oxygen or oxygen-containing atmosphere, a water vapour atmosphere, and the like. Other atmospheres may be used in the practice of the present invention, if they are effective to conduct curing of the polycarbosilane.

Figure 2:
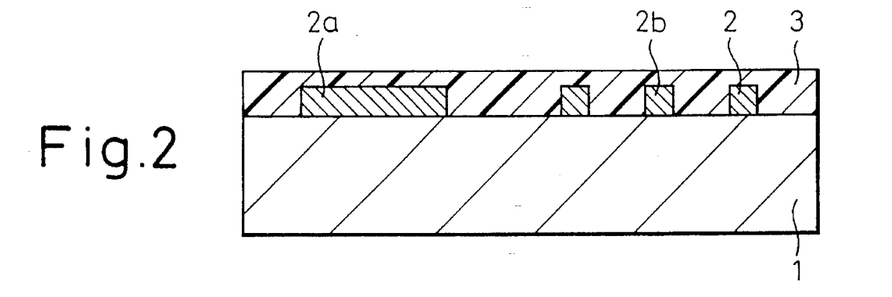
FIG. 2 is a cross-sectional view of a semiconductor device according to the present invention having a planarized dielectric layer.

The resulting silicon oxide layer 3 as a dielectric layer is illustrated in FIG. 2 which is attached for comparison with the defective dielectric layer of FIG. 1. As illustrated in FIG. 2, the silicon oxide layer 3 has a flat surface not reproducing steps 2a (wide step) and 2b (narrow step) of the underlying metal layer 2. The flat surface of the layer 3 means that a global planarization was accomplished according to the present invention.

The other steps for producing the semiconductor device according to the present invention can be carried out following the procedures well-known in the filed of semiconductor technology. Reference should be made to patent and other publications describing semiconductor devices and production thereof.

In connection with the above description, the production of semiconductor devices according to a preferred embodiment of the present invention will be further described with reference to FIGS. 4A to 4E which show a two-level metallization scheme.

Figure 4A:
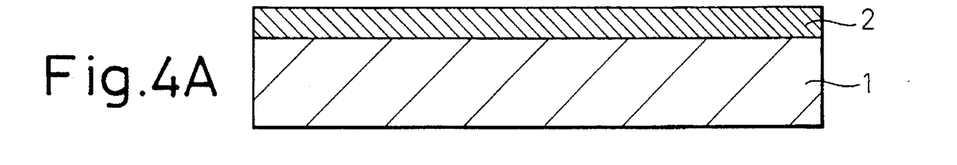
FIGS. 4A to 4E are cross-sectional views schematically illustrating, in sequence, the production of the semiconductor device according to a preferred embodiment of the present invention.
Figure 4B:
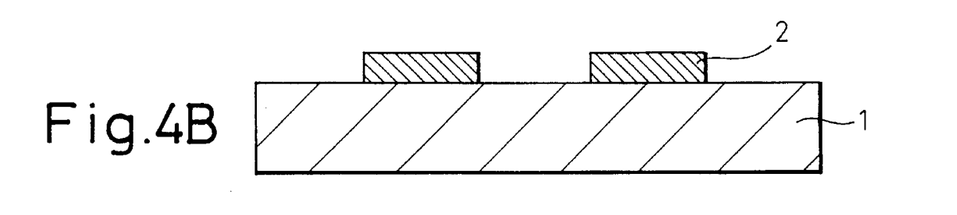
Figure 4C:
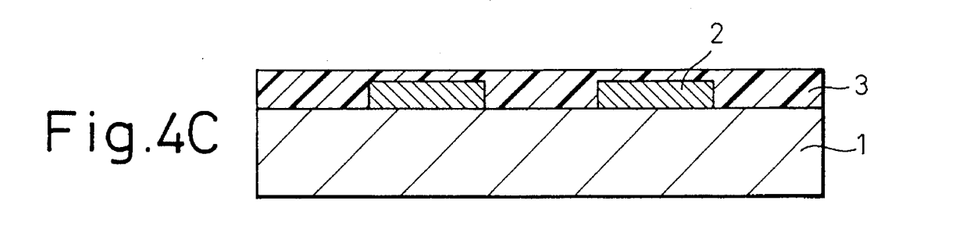

First, as shown in FIG. 4A, an aluminum layer 2 with a thickness of about 1.0 μm is deposited over a silicon substrate 1 by sputtering. The aluminum layer 2 is then selectively etched to form a first aluminum wiring layer 2. As shown in FIG. 4B, the wiring layer 2 has stepped patterns of aluminum. A solution of the polycarbosilane in a xylene is spin-coated at a rate of about 3000 rpm over the stepped wiring layer 2 to make a layer thickness of about 2 μm, heated at 250° C. for 2 minutes to melt the resin, and then cured at a temperature of 450° C. for 30 minutes in an oxygen ($O_2$) atmosphere. The resulting dielectric layer 3 having a flat surface is shown in FIG. 4C.

Figure 4D:
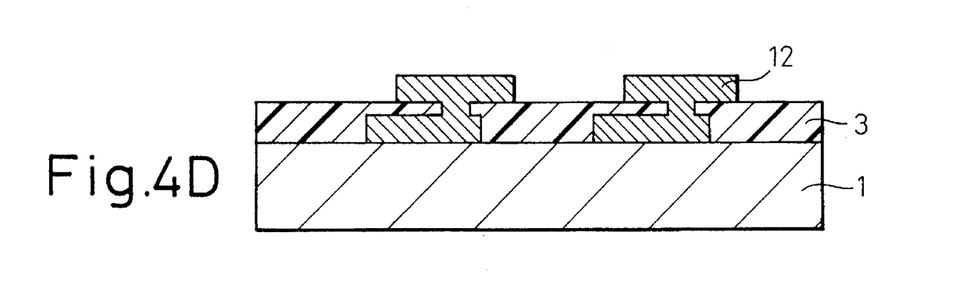
Figure 4E:
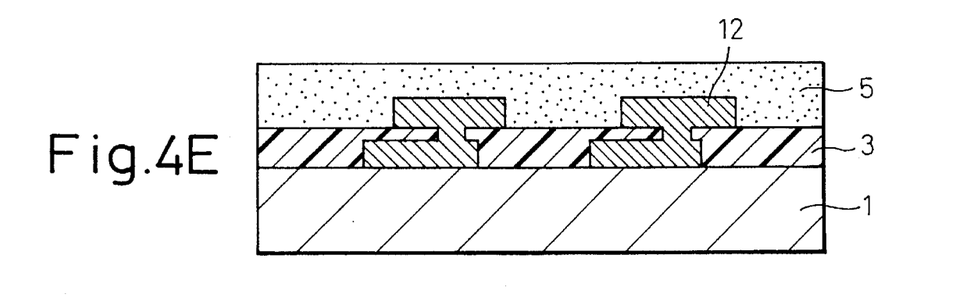

Following the formation of the dielectric layer, a second and patterned aluminum wiring layer is deposited over the dielectric layer. First, the dielectric layer is selectively etched in accordance with a conventional photolithographic process to form through-holes for connecting the previously formed first wiring layer and a second wiring layer which will be deposited in the next step. Then, the second wiring layer is deposited and pattern-wise etched in the manner similar to that used in the formation of the first wiring layer. As is shown in FIG. 4D, the second wiring layer 12 is electrically connected through the filled through-holes with the first wiring layer 2. Finally, as is shown in FIG. 4E, a phosphosilicate glass is deposited over the second wiring layer 12 with a CVD process to form a protective layer 5 having a layer thickness of about 1.3 μm. Although not illustrated with reference to the drawing, contact holes or windows for fabricating electrodes thereon are then opened at the predetermined sites of the resulting protective layer.

In a preferred embodiment of the present invention, a solution of the polycarbosilane of the general formula (1) wherein $R_1$ is a hydrogen atom or a methyl group and $R_2$ is a methylene or methyn group is spin-coated onto the topographic substrate, and then cured at a temperature of not less than 400° C. in an oxidizing atmosphere.

Preferably, the coating solution is prepared by dissolving the selected polycarbosilane having a low molecular weight in an organic solvent such as MIBK and the like to control the viscosity of the resulting solution. The coating of the polycarbosilane is preferably cured at a temperature of 400° to 450° C. to initiate a condensation polymerization of the polycarbosilane. As a result, the polycarbosilane is decomposed so that alkyl groups are cleaved-off from the side chains of the polycarbosilane and at the time, the main chain of the same is divided into silane ($SiH_4$) and methylene ($CH_2$). Since curing is carried out in an oxidizing atmosphere, the growth of silicon oxide layer is accelerated over the metal layer. In addition, since decomposition products of the polycarbosilane can be easily evaporated, it is possible to inhibit generation of an internal strain and accordingly generation of cracking in the resulting dielectric layer. Further, it is noted that a global planarization can be accomplished in the dielectric layer. Furthermore, these features mean that according to the present invention, semiconductor devices can be produced with a high reliability.

In another preferred embodiment of the present invention, a solution of the polycarbosilane of the general formula (1) wherein $R_1$ is a hydrogen atom or a methyl group and $R_2$ is a methylene or methyn group is spin-coated onto the topographic substrate, heated to a temperature of not more than 350° C. to cause melting thereof, and then cured at a temperature of not less than 400° C. in an oxidizing atmosphere, preferably an oxygen-containing atmosphere.

The above-described method is advantageously applicable to the formation of a relatively thick dielectric layer having a thickness of 0.5 μm or more, which layer thickness is useful in the planarization of the steps of the underlying metal layer.

The polycarbosilane used in the described method do not exhibit a reduction of density in the resulting dielectric layer, because the organic groups such as methyl group as well as the backbone and side chain protons are concurrently oxidized. Accordingly, the dielectric layer can be used in the production of semiconductor devices without suffering from damage due to heat or plasma of the applied processing and the like.

As mentioned above, the spin-coated layer is cured at a temperature of 350° C. or more for oxidation. More preferably, curing is carried out at a temperature of 400° C. or more, most preferably, in a temperature range of 400° to 450° C. At the same time, application of an oxygen-containing atmosphere is effective, because it enables an effective oxidation process. A resistance to heat in the subsequent heat processing steps is considered to be induced based on these curing conditions.

Further, the polycarbosilane used can be melted at a relatively low temperature enabling excellent planarization. This also means that the resulting dielectric layer is effective as an interlayer dielectric layer in semiconductor devices having a multilevel metallization structure.

As can be appreciated from the above descriptions, using the above-specified polycarbosilane, it becomes possible to smooth the stepped surface of the underlying metal layer, while maintaining an excellent dielectric property comparable to that of the prior art dielectric layer using an inorganic dielectric material, and also to produce reliable semiconductor devices having a multilevel metallization structure. In addition to the production of the semiconductor devices, the described polycarbosilane is also useful in planarization of the surface of the thin layer circuit boards and formation of dielectric layer therein. Also, the dielectric layer thus formed can be used as a protective layer for semiconductor devices and other devices.

In another preferred embodiment of the present invention, the polycarbosilane of the general formula (1), after spin-coating, is subjected to two different thermal processing steps, i.e., a first step for melting the coated layer and a second step for oxidation. Preferably, a solution of the polycarbosilane of the formula (1) is spin-coated onto the topographic substrate, heated to a temperature of not more than 300° C., and then cured at a temperature of not less than 350° C. in an oxidizing atmosphere.

In an aspect of this process, the polycarbosilane of the general formula (1) is an insoluble recovered from the solution of the polycarbosilane represented by the formula (1), but having different m/n ratios in a solvent selected from nonprotic polar solvents or halogenated hydrocarbons.

In another aspect of this process, the polycarbosilane of the general formula (1) is a fraction recovered from the polycarbosilane of the formula (1) by gel-permeation chromatography (GPC) thereof, the fraction having a weight average molecular weight of not more than 2000 when calculated in terms of the molecular weight of polystyrene. The GPC is used for obtaining the specified polycarbosilane having a suitable distribution of molecular weight, and the solvent used therein is tetrahydrofuran (THF), for example.

Using the above-described method, it is possible to form a relatively thick dielectric layer having a thickness of 0.5 μm or more useful in the planarization of the steps of the underlying metal layer.

The polycarbosilane used in the described method exhibits less strain due to oxidation and cracking in the resulting dielectric layer, because the methyl group of the side chain thereof is decomposed into protons and methylene as a result of formation of carbosilane. Further, since it has a low oxidation temperature, the polyorganosilane is very effective to use after oxidation thereof.

The oxidation of the polycarbosilane is preferably carried out by curing it at a temperature of 350° C. or more. More preferably, curing is carried out at a temperature of 400° C. or more, most preferably, in a temperature range of 400° to 450° C. At the same time, for attaining effective oxidation, it is contemplated to apply an oxygen-containing atmosphere during the curing process. Consequently, the siloxane skeleton which can contribute to increase resistance to heat in the subsequent heat processing steps is formed in the polycarbosilane.

Further, since the polycarbosilane used can be melted at a relatively low temperature, it enables excellent planarization and accordingly, provides a dielectric layer which is effective as an interlayer dielectric layer in semiconductor devices.

Furthermore, the polycarbosilane used is also effective in the production process of semiconductor devices using an etching back process, because it is possible to diminish the etching back to the minimum level due to an excellent global planarization accomplished using the polycarbosilane.

As will be appreciated from the above descriptions, using the above-specified polycarbosilane, it becomes possible to smooth the stepped surface of the underlying metal layer, while maintaining an excellent dielectric property comparable to that of the prior art dielectric layer using an inorganic dielectric material, and also to produce reliable semiconductor devices having a multilevel metallization structure. In addition to the production of the semiconductor devices, the described polycarbosilane is also useful in planarization of the surface of the thin layer circuit boards and formation of a dielectric layer therein.

In still another preferred embodiment of the present invention, the production process according to the present invention may comprise the additional step of, after coating of the polycarbosilane and prior to curing the coated layer, subjecting the coated layer to a plasma treatment using a halogen as a reactive gas to thereby substitute one or more hydrogen atoms of the $R_1$, $R_2$ and $R_3$ groups with one more halogen atoms.

Namely, the above embodiment of the present invention is based on the finding that after a layer of polycarbosilane, i.e., organosilicon polymer having an alkyl and/or alkylene group is deposited or coated over the metal layer, hydrogen atoms contained in the molecule of the polymer are substituted with halogen atoms from a plasma thereof to thereby lower the dielectric constant of the halogen-substituted polycarbosilane, while maintaining physical properties such as planarization, resistance to cracking and the like of the unsubstituted polycarbosilane used. The lowered dielectric constant and excellent physical properties mean that the process of this embodiment can be advantageously applied to the production of high-speed devices. Also, it is noted that the halogen-substituted polycarbosilane can not be oxidized when subjected to an oxygen plasma in the resist removal step or related steps, because the hydrogen atoms of the alkyl and/or alkylene group of the polycarbosilane have been already substituted with the halogen atoms.

In the practice of this embodiment, the steps until the polycarbosilane is coated over the metal layer and the curing step can be carried out in accordance with the method described above with regard to the preferred embodiments of the present invention. Similarly, the polycarbosilane used as a dielectric material may be anyone of the polycarbosilanes represented by the abovementioned formula (1). Note that the polycarbosilanes used herein are not further restricted, insofar as they do not contain any siloxane bond.

The present process including the above-mentioned halogen substitution step can be preferably carried out, if the solution of polycarbosilane of the general formula (1) from which a siloxane group is excluded is spin-coated onto the metal layer and then is subjected to a plasma treatment using fluorine as a reactive gas to thereby substitute one or more hydrogen atoms of the polycarbosilane molecule with one or more fluorine atoms, and then the fluorine-substituted polycarbosilane is cured at a temperature of not less than 350° C. in an oxidizing atmosphere.

The halogen-substituted polycarbosilane can be coated over the underlying metal layer in a relatively thick layer, because it has a resistance to chemical effects caused during the processing with highly active chemical species in the multilevel metallization process such as oxidation during the $O_2$ plasma ashing. Since the dielectric layer can be coated with a large thickness sufficient to protect the underlying layer, damage to the same layer can be completely prevented in the multilevel wiring process.

Moreover, according to the present process, since the physical properties of the dielectric layer can be varied depending upon particulars of the polycarbosilane used, it becomes possible to freely control the physical properties of the resulting layer by suitably selecting the polycarbosilane to be coated. And, as previously mentioned, the polycarbosilane can be spin-coated, and accordingly, it becomes possible to avoid use of an expensive processing apparatus such as CVD apparatus. It is also noted that fine patterns of through-holes can be produced by using a dry process.

Further, the substitution of hydrogen atoms with halogen atoms in the polycarbosilane according to a preferred embodiment of the present invention will be described with reference to FIGS. 5A to 5D and FIGS. 6A to 6C.

Figure 5A:
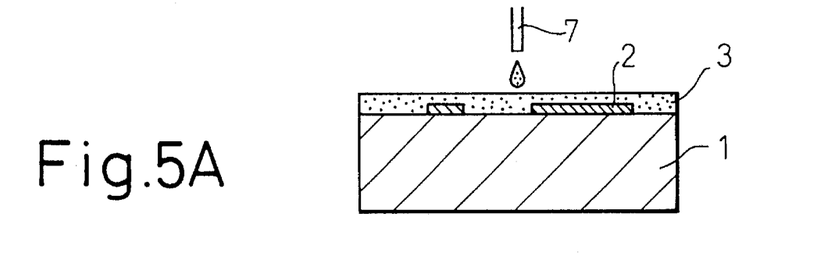
FIGS. 5A to 5D are cross-sectional views schematically illustrating, in sequence, the formation of a dielectric layer from a fluorine-substituted polycarbosilane according to a preferred embodiment of the present invention.

The semiconductor substrate used herein is a silicon substrate 1 having applied over a surface thereof a patterned aluminum (Al) wiring layer 2. To form a dielectric layer, a solution of the selected polycarbosilane represented by the general formula (1) in an organic solvent such as MIBK is dropwise added over the wiring layer 2 from a dropping nozzle 7. Spin-coating is made by using a conventional spin-coater to form a layer 3 of the polycarbosilane solution.

Figure 5B:
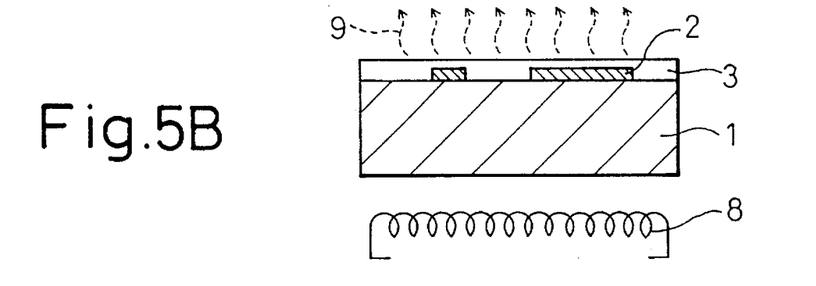

Then, the solvent contained in the layer 3 is evaporated by heating the substrate 1 to a temperature above the boiling temperature of the solvent used, over a heater 8. As is illustrated in FIG. 5B, the evaporated solvent 9 is released from the layer 3.

Figure 5C:
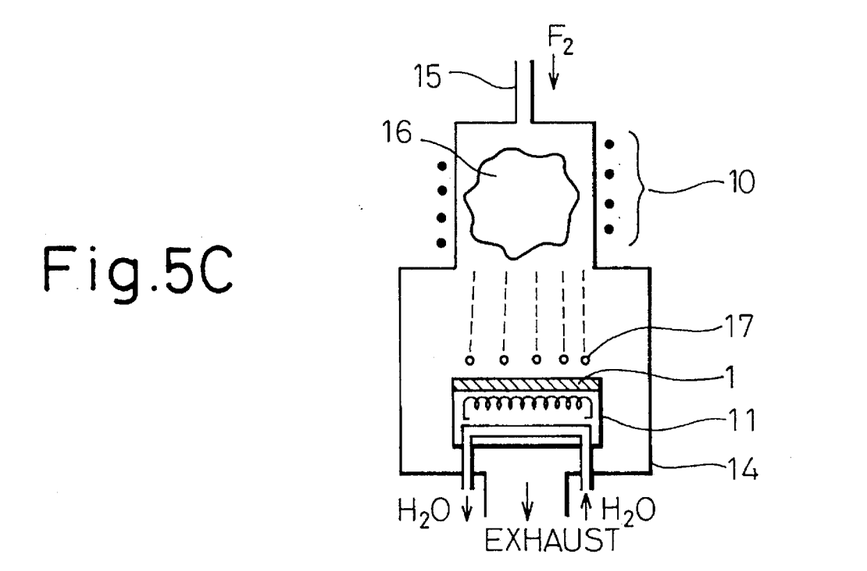

After formation of the dried polycarbosilane layer, the hydrogen atoms of the polycarbosilane are substituted with halogen atoms in a radical reactor. In the illustrated example, fluorine is used as halogen. The radical reactor, as illustrated in FIG. 5C, comprises a reaction chamber 14 provided with a high-frequency electric source 10 in an upper portion thereof. The substrate 1 is located on a stage 11 with the built-in heater, and the chamber 14 is evacuated to a vacuum of $5 \times 10^{-6}$ Torr. After completion of the evacuation, fluorine gas is introduced at a flow rate of 200 sccm through a gas conduit 15 into the chamber 14. The pressure within the chamber is increased to 0.3 Torr. With the introduction of fluorine gas, the high-frequency electric source 10 is operated to generate fluorine plasma 16 which then generates chemically active spices (fluorine radicals). The applied RF power from the electric source is 300 W. The generated fluorine radicals 17 reach a surface of the polycarbosilane layer (not shown) deposited over the substrate 1. The radicals 17 migrate from a surface portion of the polycarbosilane layer to an inner portion thereof, and the intended substitution reaction occurs during the migration of the radicals. The substitution reaction proceeds at a substrate temperature of 200° C. for 30 minutes. After the substitution reaction is completed, the introduction of fluorine gas is discontinued or stopped, the chamber 14 is evacuated to 0.003 Torr, heating of the substrate 1 is stopped, and then the chamber 14 is cooled under reduced pressure.

Figure 5D:
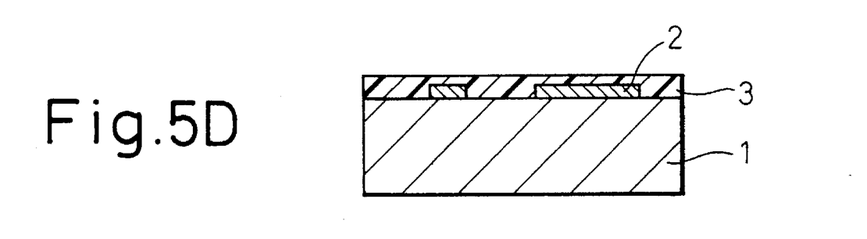

Finally, the fluorine-substituted polycarbosilane is cured at a temperature of 450° C. for 30 minutes in an oxygen ($O_2$) atmosphere, for example. The resulting dielectric layer 3 has a flat surface as is shown in FIG. 5D.

The principle or mechanism of the above-described substitution reaction will be further explained with reference to FIGS. 6A to 6C.

Figure 6A:
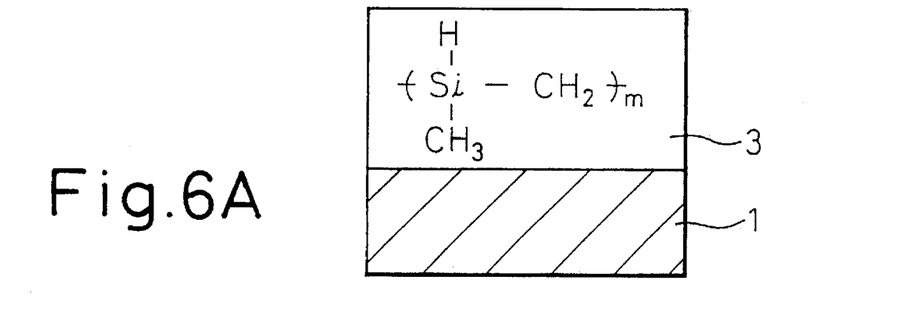
FIGS. 6A to 6C are cross-sectional views schematically illustrating, in sequence, substitution of hydrogen atoms with fluorine atoms in the formation of the dielectric layer as illustrated in FIGS. 5A to 5D.
Figure 6B:
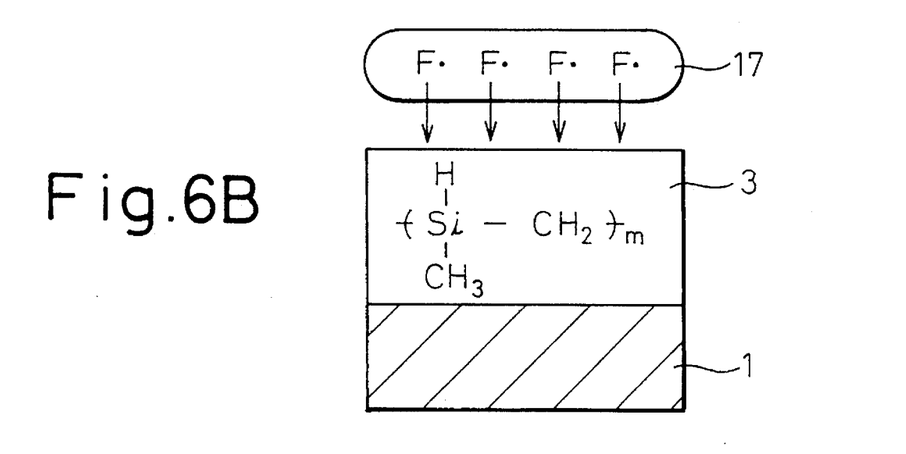
Figure 6C:
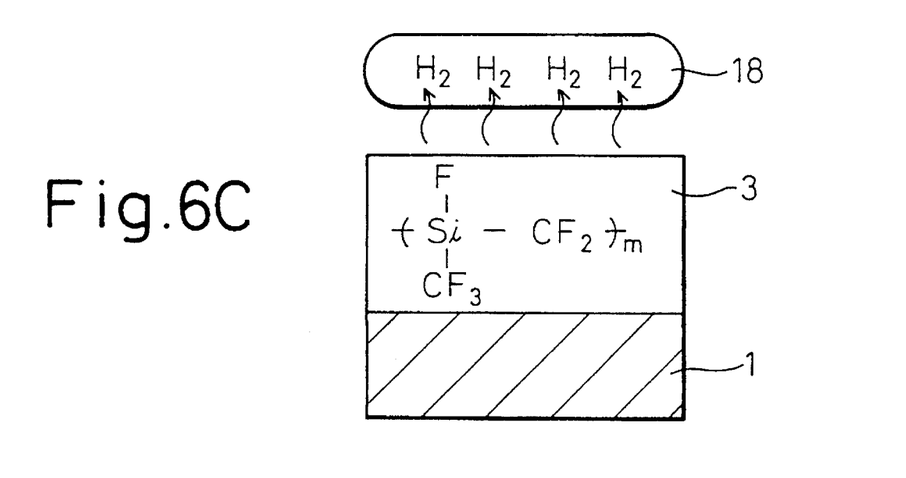

As is shown in FIG. 6A, the silicon substrate 1 has a layer 3 of the polycarbosilane of the formula (1). Note that while not illustrated to simplify the layer structure, the layer 3 is coated over the patterned wiring layer deposited on the substrate 1. The fluorine radicals 17 generated in a reaction chamber (not shown) are injected into the polycarbosilane layer 3 as is shown in FIG. 6B. In the polycarbosilane layer 3, as is shown in FIG. 6C, the substitution of hydrogen atoms with fluorine atoms occurs. The generated hydrogen gas 18 is released from the layer 3 which then forms a fluorine-substituted polycarbosilane.

The production process according to the present invention can be advantageously used in the formation of an interlayer dielectric layer. In such a case, as is conventionally carried out, it is contemplated that another metal layer having electrically conductive components fabricated therein is deposited over the formed dielectric layer.

Similarly, the production process according to the present invention can be advantageously used in the formation of a protective layer. In such a case, the metal layer having electrically conductive components fabricated therein is the uppermost layer and thus the resulting silicon oxide layer is able to act as a protective layer from the environment and others.

It will be appreciated that the dielectric layer produced in the production process of the present invention can be also used in the semiconductor devices for different purposes other than as the interlayer dielectric layer and protective layer.

The present invention will be further described referring to the following working examples thereof. Note, however, that the present invention is not restricted to these examples.

EXAMPLE 1

An aluminum layer having a thickness of 1 μm is deposited over the silicon substrate by sputtering. The resulting aluminum layer is pattern-wise etched with a photolithographic process to form a first wiring layer having a minimum line width of 1 μm and a minimum space width of 1 μm.

The 50% solution of polycarbosilane is prepared by dissolving polycarbosilane in xylene to control the viscosity. The solution of the polycarbosilane is spin-coated at a thickness of 2 μm, and heated at 150° C. for 2 minutes to evaporate the solvent from the layer. Thereafter, the polycarbosilane layer is cured at 450° C. for 30 minutes in an oxygen atmosphere to produce an interlayer dielectric layer. The dielectric layer has a flat surface and indicates that a global planarization has been accomplished. The height of the remaining steps observed in the layer surface is 0.1 μm or less.

Thereafter, through-holes are opened in the predetermined sites of the resulting dielectric layer, and a second wiring layer of aluminum is deposited in a manner similar to that of the formation of the above-mentioned first wiring layer. A protective layer of phosphosilicate glass having a thickness of 1.3 μm is deposited over the second wiring layer with a CVD process. The protective layer is selectively etched off to open contact holes for fabricating electrodes. The thus produced semiconductor device is heated at 450° C. for one hour in an air atmosphere, and then subjected to a heat cycle test of 10 iterations from −65° to +150° C. No disconnection of wiring is observed.

EXAMPLE 2

An aluminum layer having a thickness of 1 μm is deposited over the silicon substrate by sputtering. The resulting aluminum layer is pattern-wise etched with a photolithographic process to form a first wiring layer having a minimum line width of 1 μm and a minimum space width of 1 μm.

The 30% solution of polycarbosilane is prepared by dissolving polycarbosilane in xylene to control the viscosity. The solution of the polycarbosilane is spin-coated at a thickness of 1 μm, and heated at 250° C. for 2 minutes to evaporate the solvent from the layer. Thereafter, the polycarbosilane layer is cured at 450° C. for 30 minutes in an oxygen atmosphere to produce an interlayer dielectric layer. The dielectric layer has a flat surface and indicates that a global planarization has been accomplished. The height of the remaining steps observed in the layer surface is 0.1 μm or less.

Thereafter, through-holes are opened in the predetermined sites of the resulting dielectric layer in a resist process. No cracking due to oxidation of the resist process is observed in the dielectric layer. After formation of through-holes, the dielectric layer is treated with 2.5% hydrofluoric acid, and the through-holes thereof are filled with an aluminum. A second wiring layer of aluminum is deposited in a manner similar to that of the formation of the above-mentioned first wiring layer. A protective layer of phosphosilicate glass having a thickness of 1.3 μm is deposited over the second wiring layer with a CVD process. The protective payer is selectively etched off to open contact holes for fabricating electrodes. Thus, the semiconductor device is produced. The semiconductor device is heated at 450° C. for one hour in an air atmosphere, and then subjected to a heat cycle test of 10 iterations from −65° to +150° C. No disconnection of wiring is observed.

EXAMPLE 3

The procedure of Example 2 is repeated except that a P-CVD silicon oxide layer having a thickness of about 0.5 μm is sandwiched between the first wiring layer and the polycarbosilane layer. The resulting dielectric layer has a flat surface and indicates that a global planarization has been accomplished. The height of the remaining steps observed in the layer surface is 0.2 μm or less. Further, no cracking due to oxidation of the resist process is observed in the dielectric layer. The semiconductor device is heated at 450° C. for one hour in an air atmosphere, and then subjected to a heat cycle test of 10 iterations from −65° to +150° C. No disconnection of wiring is observed.

EXAMPLE 4

Polycarbosilane ("Tilanocoat" commercially available from Ube Industries, Co.Ltd.; carbosilane product of polydimethylsilane) is dissolved in diethylether, and the solution is kept to stand to separate a soluble and an insoluble. The insoluble is recovered and a MIBK solution thereof is spin-coated at a thickness of about 1.5 μm over the silicon substrate to evaluate the conditions of the resulting coating. The coating is uniform and contains no microcrystals which were observed in the polycarbosilane (without above treatment).

EXAMPLE 5

The procedure of Example 4 is repeated except that chloroform is used in place of diethylether. A uniform coating comparable to that of Example 4 is thus obtained.

EXAMPLE 6

The procedure of Example 4 is repeated except that the GPC using tetrahydrofuran (THF) is utilized in place of a solvent extraction using diethylether, and the solution of polycarbosilane is subjected to gel-permeation chromatography on a preparative liquid chromatographic apparatus to conduct a fractionation of the molecular weight of the polycarbosilane. The fraction recovered has a weight average molecular weight of not more than 2000 in terms of the molecular weight of polystyrene. The fraction is dissolved in MIBK, and is spin-coated over the silicon substrate. The coating is uniform and contains no microcrystals which were observed in the starting polycarbosilane.

EXAMPLE 7

An aluminum layer having a thickness of 1 μm is deposited over the silicon substrate by sputtering. The resulting aluminum layer is pattern-wise etched with a photolithographic process to form a first wiring layer having a minimum line width of 1 μm and a minimum space width of 1 μm.

The 40% solution of polycarbosilane is prepared by dissolving polycarbosilane prepared in each of Examples Nos. 4 to 6 in MIBK solvent to control the viscosity. The solution of the polycarbosilane is spin-coated at a thickness of 2 µm, and heated at 150° C. for 5 minutes to evaporate the solvent from the layer. Thereafter, the polycarbosilane layer is cured at 450° C. for 30 minutes in an oxygen atmosphere to produce an interlayer dielectric layer. The dielectric layer has a flat surface and indicates that a global planarization has been accomplished. The height of the remaining steps observed in the layer surface is 0.1 µm or less.

Thereafter, through-holes are opened in the predetermined sites of the resulting dielectric layer, and a second wiring layer of aluminum is deposited in a manner similar to that of the formation of the above-mentioned first wiring layer. A protective layer of phosphosilicate glass having a thickness of 1.3 µm is deposited over the second wiring layer with a CVD process. The protective layer is selectively etched off to open contact holes for fabricating electrodes. Thus, the semiconductor device is produced. The semiconductor device is heated at 450° C. for one hour in an air atmosphere, and then subjected to a heat cycle test of 10 iterations from –65° to +150° C. No disconnection of wiring is observed.

EXAMPLE 8

This is a comparative example.

The procedure of Example 4 is repeated except that methanol is used in place of diethylether. No separation of polycarbosilane is accomplished, because an undesirable reaction between the polycarbosilane and silicon hydride (SiH) is occurs.

EXAMPLE 9

An aluminum layer having a thickness of 1 µm is deposited over the silicon substrate by sputtering. The resulting aluminum layer is pattern-wise etched with a photolithographic process to form a first wiring layer having a minimum line width of 1 µm and a minimum space width of 1 µm.

The 30% solution of polycarbosilane is prepared by dissolving polycarbosilane in xylene solvent to control the viscosity. The solution of the polycarbosilane is spin-coated at 3000 rpm for 30 seconds to make a layer thickness of 1 µm, and heated at 250° C. for 10 minutes in an inert gas atmosphere to evaporate the solvent from the layer.

Thereafter, the polycarbosilane layer is subjected to a fluorination process in accordance with the manner described in Japanese Unexamined Patent Publication (Kokai) No. 5-262819 assigned to Fujitsu Limited, the disclosure of which is incorporated herein for reference. The conditions for this fluorination process are those described hereinabove with reference to FIG. 5C.

The fluorinated polycarbosilane is cured at 450° C. for 30 minutes in an oxygen atmosphere to produce an interlayer dielectric layer. The dielectric layer has a flat surface and indicates that a global planarization has been accomplished. The height of the remaining steps observed in the layer surface is 0.3 µm or less. The dielectric constant is determined to be 2.5.

Thereafter, through-holes are opened in the predetermined sites of the resulting dielectric layer in a conventional resist process. No cracking due to oxidation of the resist process such as removal by plasma ashing is observed in the dielectric layer. After formation of through-holes, the dielectric layer is treated with 2.5% hydrofluoric acid, and the through-holes thereof are filled with aluminum. I.e., a second wiring layer of aluminum is deposited in a manner similar to that of the formation of the above-mentioned first wiring layer. A protective layer of phosphosilicate glass having a thickness of 1.3 µm is deposited over the second wiring layer with a CVD process. The protective layer is selectively etched off to open contact holes for fabricating electrodes. Thus, the semiconductor device is produced. The semiconductor device is heated at 450° C. for one hour in an air atmosphere, and then subjected to a heat cycle test of 10 iterations from –65° to +150° C. No disconnection of wiring is observed.

EXAMPLE 10

The procedure of Example 9 is repeated except that polycarbosilastyrene is used in place of polycarbosilane. The results are comparable to those of Example 9. For example, the dielectric layer has a flat surface and indicates that a global planarization has been accomplished. The height of the remaining steps observed in the layer surface is 0.3 µm or less. The dielectric constant is determined to be 2.8. No cracking due to oxidation of the resist process is observed in the dielectric layer after formation of through-holes.

EXAMPLE 11

This is a comparative example.

The procedure of Example 9 is repeated except that the conventional organic SOG containing siloxane bonds and methyl side chains; polymethylsilsesquioxane is used in place of polycarbosilane. A semiconductor device can not be produced, because the SOG layer is completely etched-off from the underlying first wiring layer with the fluorine plasma during the fluorination process.

EXAMPLE 12

This is a comparative example.

The procedure of Example 9 is repeated except that the commecially available polyethylene resin is used in place of polycarbosilane. A defective semiconductor device is produced, because cracking is caused in the dielectric layer because of decomposition of the organic groups thereof. It is noted that the used polyethylene resin do not satisfy the requirement for high resistance to heat.

What is claimed is:

1. A process for the production of a semiconductor device which comprises the steps of applying a solution of polycarbosilane of the general formula (1):

in which

R$_1$ represents a hydrogen atom, a substituted or unsubstituted alkyl group having 1 to 4 carbon atoms or a substituted or unsubstituted aryl group;

R$_2$ represents a substituted or unsubstituted methylene or methyn group; and m and n each is a positive integer satisfying the condition of 10<m+n<1000 and a ratio of m and N is less than 0.3, in a solvent onto a substrate having electrically conductive components fabricated therein, and curing the coated layer of the polycarbosilane at a temperature of not less than 350° C. in an oxidizing atmosphere to thereby convert the polycarbosilane layer to a silicon oxide layer.

2. The process according to claim 1 in which the alkyl group is a methyl group.

3. The process according to claim 1 in which the aryl group is a phenyl group.

4. The process according to claim 1 in which the solution of polycarbosilane is spin-coated onto the topographic substrate.

5. The process according to claim 1 in which the solution of polycarbosilane of the general formula (1) wherein $R_1$ is a hydrogen atom or a methyl group and $R_2$ is a methylene or methyn group is spin-coated onto the topographic substrate, heated to a temperature of not more than 350° C., and then cured at a temperature of not less than 400° C. in an oxidizing atmosphere.

6. The process according to claim 5 in which the polycarbosilane of the general formula (1) is an insoluble recovered from the solution of the polycarbosilane represented by the formula (1), but having different m/n ratios in a solvent selected from nonprotic polar solvents or halogenated hydrocarbons.

7. The process according to claim 5 in which the polycarbosilane of the general formula (1) is a fraction received from the polycarbosilane of the formula (1) by gel-permeation chromatograph thereof, the fraction having a weight average molecular weight of not more than 2000 when calculated in terms of the molecular weitht of polystyrene.

8. The process according to claim 1 in which the solution of polycarbosilane of the general formula (1) wherein $R_1$, $R_2$, m and n are as defined above, is spin-coated onto the topographic substrate, subjected to a plasma treatment using fluorine as a reactive gas to thereby substitute one or more hydrogen atoms of the polycarbosilane molecule with one or more fluorine atoms, and then cured the fluorine-substituted polycarbosilane at a temperature of not less than 350° C. in an oxidizing atmosphere.

9. The process according to anyone of claims 1 to 8 which further comprises the step of forming another device having electrically conductive components fabricated therein over the resulting silicon oxide layer.

10. The process according to anyone of claims 1 to 8 in which a layer having electrically conductive components fabricated therein is the uppermost layer and thus the resulting silicon oxide layer is able to act as a protective layer from the environment.

* * * * *